(12) United States Patent
Segawa

(10) Patent No.: US 10,269,661 B2
(45) Date of Patent: Apr. 23, 2019

(54) MANUFACTURING SYSTEM FOR SEMICONDUCTOR DEVICE, METHOD OF MANUFACTURING SEMICONDUCTOR DEVICE, AND CONTROL DEVICE

(71) Applicant: Toshiba Memory Corporation, Minato-ku (JP)

(72) Inventor: Kazuhiro Segawa, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/696,394

(22) Filed: Sep. 6, 2017

(65) Prior Publication Data

US 2018/0277451 A1    Sep. 27, 2018

(30) Foreign Application Priority Data

Mar. 23, 2017   (JP) ................................ 2017-058119

(51) Int. Cl.
*H01L 21/66*   (2006.01)
*H01L 21/67*   (2006.01)

(52) U.S. Cl.
CPC ........ *H01L 22/20* (2013.01); *H01L 21/67288* (2013.01)

(58) Field of Classification Search
None
See application file for complete search history.

(56) References Cited

U.S. PATENT DOCUMENTS

| | | | |
|---|---|---|---|
| 9,588,441 B2 * | 3/2017 | MacNaughton | .... G03F 7/70525 |
| 2008/0316442 A1 | 12/2008 | Adel et al. | |
| 2012/0202302 A1 * | 8/2012 | Shimizu | .................. H01L 22/20 438/14 |
| 2013/0089935 A1 | 4/2013 | Vukkadala et al. | |
| 2015/0120216 A1 | 4/2015 | Vukkadala et al. | |
| 2018/0096906 A1 * | 4/2018 | Levy | ...................... C23C 14/547 |

FOREIGN PATENT DOCUMENTS

| | | |
|---|---|---|
| JP | 2008-076157 | 4/2008 |
| JP | 2010-529659 | 8/2010 |
| JP | 2013-239534 | 11/2013 |
| JP | 2014-534631 | 12/2014 |
| JP | 2015-043452 | 3/2015 |
| JP | 2016-538717 | 12/2016 |

\* cited by examiner

*Primary Examiner* — Thien F Tran
(74) *Attorney, Agent, or Firm* — Oblon, McClelland, Maier & Neustadt, L.L.P.

(57) ABSTRACT

According to an embodiment, a manufacturing system for a semiconductor device includes a first processing device and a second processing device, a measurement section, and an analysis section. The first processing device and the second processing device are adapted to perform a film formation process on a substrate in a wafer. The measurement section is adapted to measure a first value related to a shape of the wafer after film formation by the first processing device, and then measure a second value related to a distortion of the wafer based on the first value. The analysis section is adapted to change a film formation condition of the second processing device based on processing information of the first processing device, the second value, and information of the second processing device.

20 Claims, 6 Drawing Sheets

STACKED-LAYER IPD

UPPER-LAYER IPD

LOWER-LAYER IPD

MANUFACTURING SYSTEM FOR SEMICONDUCTOR DEVICE, METHOD OF MANUFACTURING SEMICONDUCTOR DEVICE, AND CONTROL DEVICE

CROSS-REFERENCE TO RELATED APPLICATIONS

This application is based upon and claims the benefit of priority from Japanese Patent Application No. 2017-058119, filed on Mar. 23, 2017; the entire contents of which are incorporated herein by reference.

FIELD

Embodiments of the invention relate generally to a manufacturing system for a semiconductor device, a method of manufacturing the semiconductor device, and a control device.

BACKGROUND

For manufacturing a semiconductor device, there is used a lithography method in a film formation process. In the semiconductor device, as a concern, there can be cited the fact that the superposition accuracy of the lithography method deteriorates as the number of layers stacked increases due to the miniaturization. The deterioration of the superposition accuracy incurs a decrease in yield ratio, and is therefore required to be improved.

DETAILED DESCRIPTION

Figure 1:
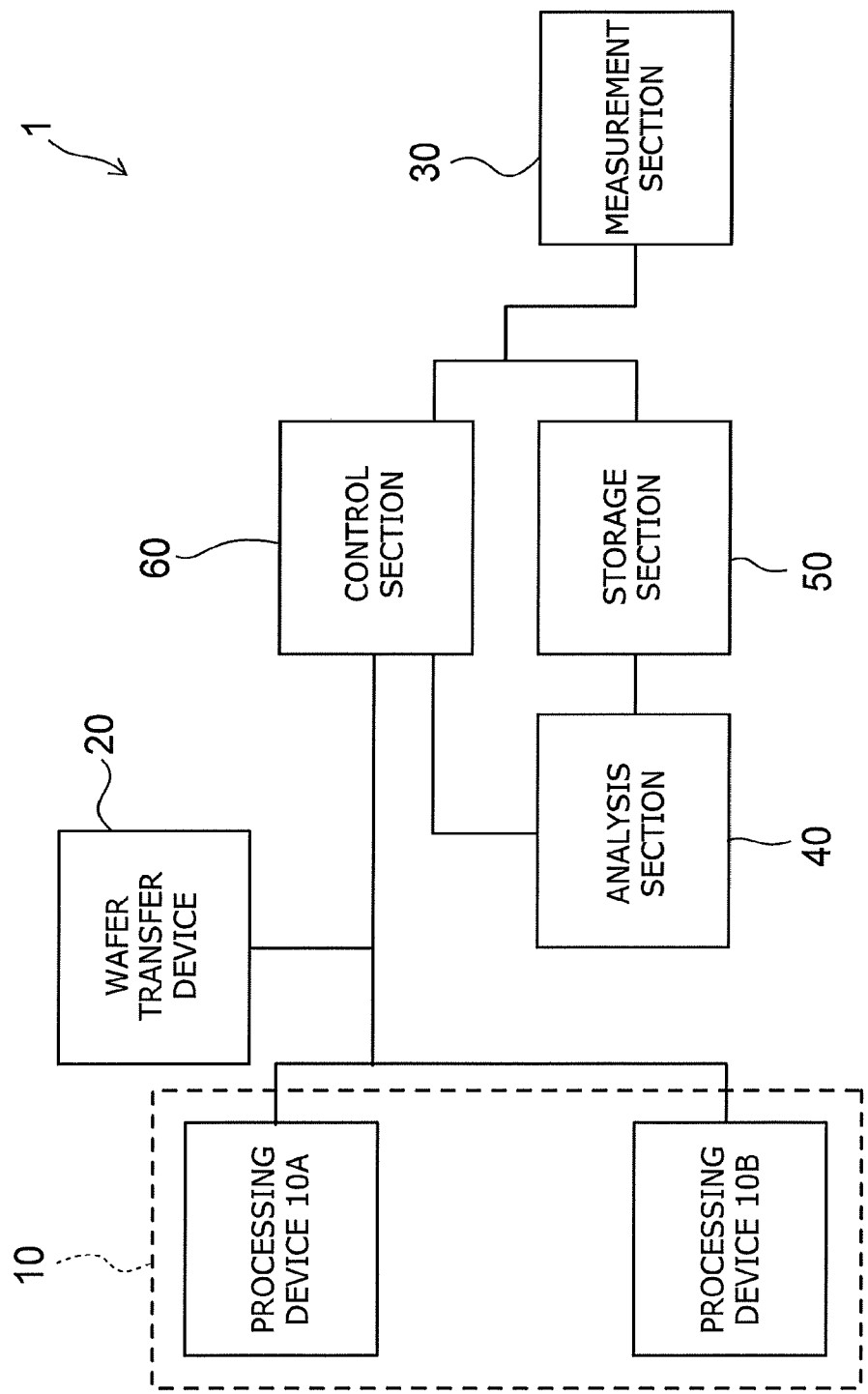
FIG. 1 is a diagram showing a manufacturing system for a semiconductor device according to an embodiment.

According to an embodiment, a manufacturing system for a semiconductor device includes a first processing device and a second processing device, a measurement section, and an analysis section. The first processing device and the second processing device are adapted to perform a film formation process on a substrate in a wafer. The measurement section is adapted to measure a first value related to a shape of the wafer after film formation by the first processing device, and then measure a second value related to a distortion of the wafer based on the first value. The analysis section is adapted to change a film formation condition of the second processing device based on processing information of the first processing device, the second value, and information of the second processing device.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

Embodiment

FIG. 1 is a block diagram showing a manufacturing system 1 for a semiconductor device.

As shown in FIG. 1, the manufacturing system 1 for the semiconductor device is provided with a processing device 10, a wafer transfer device 20, a measurement section 30, an analysis section 40, a storage section 50 and a control section 60.

The processing device 10 is, for example, a device for performing a film formation process on a wafer. For example, in the film formation process, the wafer is mounted on a stage of the processing device 10. The wafer is, for example, a silicon wafer. For example, due to the film formation process by the processing device 10, a film is formed on the wafer including a substrate. The processing device 10 can also be a device for performing an exposure process.

There is provided a plurality of processing devices 10. For example, the manufacturing system 1 for the semiconductor device is provided with the processing device 10A and the processing device 10B. For example, due to the film formation process by the processing device 10A, a lower-layer stacked body is formed on the substrate, and due to the film formation process by the processing device 10B, an upper-layer stacked body is formed on the lower-layer stacked body. The number of the processing devices 10 is arbitrary.

The wafer transfer device 20 is a device for sorting the wafers to set a notch angle to a preset angle.

The measurement section 30 measures a value related to the shape of the wafer at each of in-plane positions around the film formation process by the processing device 10. Here, the value related to the shape of the wafer is, for example, the thickness of the wafer, the height of the wafer, the flatness of the wafer surface, the displacement (the distance) of the wafer, or a value of the stress to the wafer. For example, the thickness of the wafer is expressed in the unit of micrometer, and the height of the wafer and the flatness of the wafer surface are expressed in the unit of nanometer. For example, the displacement of the wafer is a distance, and is expressed in the unit of nanometer. For example, the value of the stress to the wafer is a value of the stress due to the stacked body formed on the wafer, and is expressed in the unit of Pascal.

The value measured by the measurement section 30 is stored in the storage section 50 as a processing history of the measurement section 30.

The measurement section 30 measures a value related to the shape of the wafer after the formation of the lower-layer stacked body due to the film formation process by the processing device 10A. For example, the measurement section 30 measures the value of the displacement of the wafer after the formation of the lower-layer stacked body and before the formation of the upper-layer stacked body. Then, the in-plane distortion IPD (In-Plane Displacement/

Distortion) of the wafer is measured based on the value of the displacement of the wafer. Subsequently, the in-plane distortion IPD (see FIG. 3) of the wafer due to the processing device 10A is stored in the storage section 50 together with the processing history (context data) of the processing device 10A.

It is also possible for the measurement section 30 to measure the value of the displacement of the wafer before the formation of the lower-layer stacked body.

It is also possible for the measurement section 30 to measure the value of the displacement of the wafer after the formation of the upper-layer stacked body, or it is also possible for the in-plane distortion IPD of the wafer to be measured based on the value of the displacement of the wafer. In this case, the in-plane distortion IPD of the wafer due to the processing device 10B is stored in the storage section 50 together with the processing history of the processing device 10B.

The analysis section 40 calculates to optimize a film formation parameter based on the measurement result of the measurement section 30 after the formation of the lower-layer stacked body due to the film formation process by the processing device 10A. The film formation parameter is, for example, the notch angle of the wafer. The analysis section 40 includes, for example, an arithmetic device.

For example, the analysis section 40 calculates the notch angle of the wafer after the formation of the lower-layer stacked body and before the formation of the upper-layer stacked body based on the processing history of the processing device 10A, the in-plane distortion IPD of the wafer due to the processing device 10A, and the data of the processing device 10B. The data of the processing device 10B includes the in-plane distortion IPD of the wafer due to the processing device 10B. It is also possible for the data of the processing device 10B to include, for example, the QC (Quality Control) data of a chamber and a stage. Further, it is also possible for the data of the processing device 10B to include processing information of the chamber, the stage, and so on. The data of the processing device 10B is stored in the storage section 50.

The storage section 50 stores the processing history of the processing devices 10A, 10B. Further, the storage section 50 stores the measurement result (the processing history of the measurement section 30, and the in-plane distortion IPD of the wafer due to the processing devices 10A, 10B) of the measurement section 30. The storage section 50 includes, for example, a RAM (Random Access Memory) and a ROM (Read Only Memory).

The control section 60 controls operations of the processing device 10, the wafer transfer device 20, the measurement section 30 and the analysis section 40.

The measurement section 30, the analysis section 40, the storage section 50, and the control section 60 constitute the control device for controlling the processing of the semiconductor device. It should be noted that it is also possible for the control section 60 to include the measurement section 30 and the analysis section 40, and it is possible for the analysis section 40 to perform the measurement process by the measurement section 30.

Then, a configuration example of the manufacturing system 1 for the semiconductor device will be described.

Figure 2:
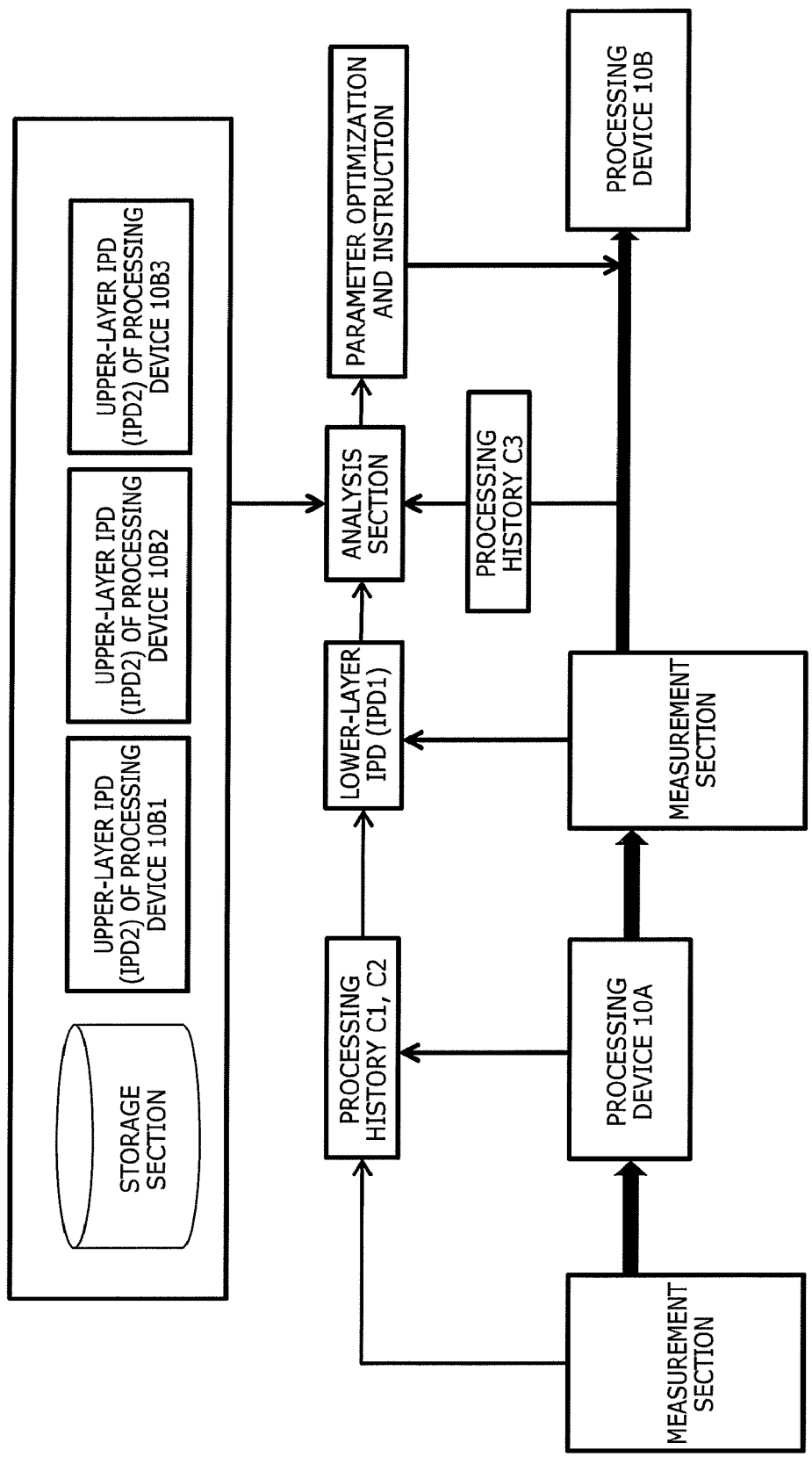
FIG. 2 is a diagram showing the manufacturing system for the semiconductor device according to the embodiment.

FIG. 2 is a block diagram showing a flow of the manufacturing system 1 for the semiconductor device.

As shown in FIG. 2, firstly, the value of the displacement of the wafer is measured by the measurement section 30 before the formation of the lower-layer stacked body. The value of the displacement of the wafer measured by the measurement section 30 is stored in the storage section 50 as the processing history C1 of the measurement section 30. The value of the displacement of the wafer can also be transmitted to the processing device 10A.

Then, the processing device 10A performs the film formation process to form the lower-layer stacked body on the substrate. For example, the processing device 10A performs the film formation process based on the value of the displacement of the wafer transmitted from the measurement section 30 to form the lower-layer stacked body on the substrate. The processing history C2 of the processing device 10A is stored in the storage section 50.

Then, after the formation of the lower-layer stacked body, the measurement section 30 measures the value of the displacement of the wafer to measure the in-plane distortion IPD1 of the wafer due to the processing device 10A. The value of the displacement of the wafer measured by the measurement section 30 is stored in the storage section 50 as the processing history C3 of the measurement section 30. The value of the displacement of the wafer measured by the measurement device 30 can also be transmitted to the processing device 10B. The in-plane distortion IPD1 of the wafer is stored in the storage section 50 as lower-layer IPD.

Then, the analysis section 40 obtains the data of the processing device 10B from the storage section 50. The data of the processing device 10B includes the in-plane distortion IPD2 of the wafer due to the processing device 10B. The in-plane distortion IPD2 of the wafer is stored in advance in the storage section 50 as upper-layer IPD. It is also possible for the data of the processing device 10B to include, for example, the QC data of the chamber and the stage. Further, it is also possible for the data of the processing device 10B to include processing information of the chamber, the stage, and so on.

In the example shown in FIG. 2, the analysis section 40 obtains the in-plane distortion IPD2 of the wafer due to the processing devices 10B1 through 10B3 from the storage section 50.

Then, the analysis section 40 calculates to optimize the film formation parameter in the case of forming the upper-layer stacked body on the lower-layer stacked body based on the processing history C2 of the processing device 10A, the in-plane distortion IPD1 of the wafer, and the data of the processing device 10B. For example, the notch angle of the wafer is calculated to be optimized so as to reduce the in-plane distortion of the wafer due to the film stress. Here, the processing history C2 of the processing device 10A and the in-plane distortion IPD1 of the wafer correspond to lower-layer processing information, and the data of the processing device 10B corresponds to upper-layer information.

The notch angle calculated by the analysis section 40 is transmitted to the wafer transfer device 20.

Then, the wafer transfer device 20 sets the notch angle of the wafer to the preset angle based on the notch angle transmitted from the analysis section 40. Subsequently, the processing device 10B performs the film formation process to form the upper-layer stacked body on the lower-layer stacked body.

Then, an example of the optimization of the film formation parameter will be described.

Figure 3:
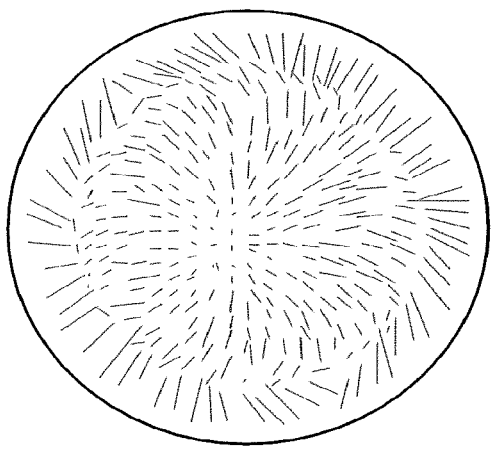
FIG. 3 is a graph showing a characteristic of the semiconductor device according to the embodiment.
Figure 3:
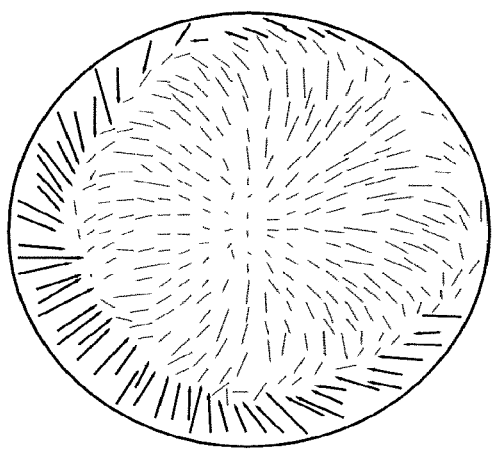
Figure 3:
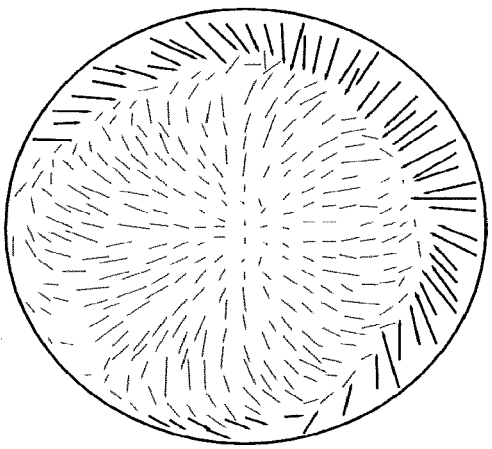

FIG. 3 shows a simulation result in the case of optimizing the notch angle of the wafer when forming the upper layer in the IPD of the stacked body including the lower layer and the upper layer. FIG. 3 shows the distributions of the IPD vector maps respectively corresponding to the lower-layer IPD, the upper-layer IPD and the stacked-layer IPD in sequence from the left.

Firstly, the method of optimizing the notch angle of the wafer will be described.

The in-plane distortion IPD (IPD1) of the wafer due to the processing device 10A after the lower-layer stacked body has been formed is measured. Subsequently, a predictive value V1 of the in-plane distortion IPD of the wafer in the case of rotating the wafer as much as, for example, 0 through 360 degrees based on the in-plane distortion IPD (IPD2) of the wafer due to the processing device 10B stored in advance is calculated.

Then, by adding the in-plane distortion IPD (IPD1) of the wafer due to the processing device 10A to the predictive value V1 of the in-plane distortion IPD of the wafer, a predictive value V2 of the in-plane distortion IPD of the wafer after the stacking is calculated.

Then, the rotational angle at which the 3-sigma magnitude value becomes minimum is calculated in the in-plane distortion IPD of the wafer after the stacking based on the rotational angle of 0 through 360, and the predictive value V2 of the in-plane distortion IPD of the wafer after the stacking. By calculating the rotational angle, the notch angle of the wafer is optimized.

For example, in the case of using such a method of optimizing the notch angle of the wafer, 176 degrees is calculated as the rotational angle at which the 3-sigma magnitude value becomes minimum. As shown in FIG. 3, if the upper-layer stacked body is formed with the notch angle of the wafer optimized (e.g., setting the notch angle of the wafer to 176 degrees), the IPD vector map in the stacked-layer IPD is apt to have a concentric distribution. It should be noted that the lines with contrasting densities show the directions and the magnitudes of the vectors in the in-plane distortion IPD of the wafer. The lines with high densities show the fact that the displacement corresponding to the magnitude of the vector is large compared to the lines with low densities.

Therefore, as shown in FIG. 3, in the case of optimizing the notch angle of the wafer, the IPD vector map in the stacked-layer IPD is apt to have the concentric distribution based on the IPD vector map in the lower-layer IPD and the IPD vector map in the upper-layer IPD. In other words, in the case of optimizing the notch angle of the wafer, in the IPD vector map in the stacked-layer IPD, a larger number of lines with low densities are disposed, and the concentric distribution is apt to occur. Thus, the in-plane distortion of the wafer due to the influence of the film stress can be reduced by adjusting the notch angle of the wafer as one of the film formation parameters. Further, the accuracy of the superposition between the lower layer and the upper layer is improved, and at the same time, the superposition between the lower layer and the upper layer can easily be controlled.

Then, a method of manufacturing the semiconductor device according to the embodiment will be described.

Figure 4:
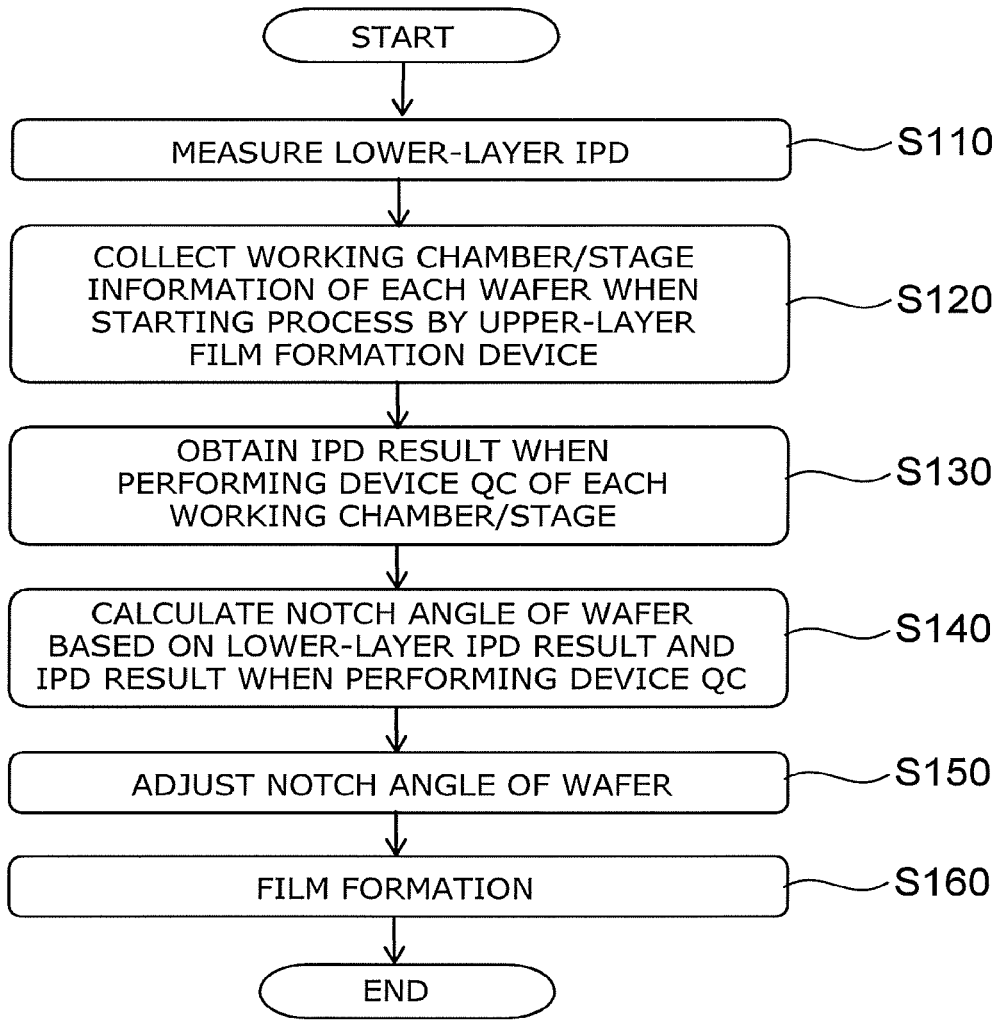
FIG. 4 is a flowchart showing a method of manufacturing the semiconductor device according to the embodiment.

FIG. 4 is a flowchart showing the method of manufacturing the semiconductor device according to the embodiment.

Figure 5:
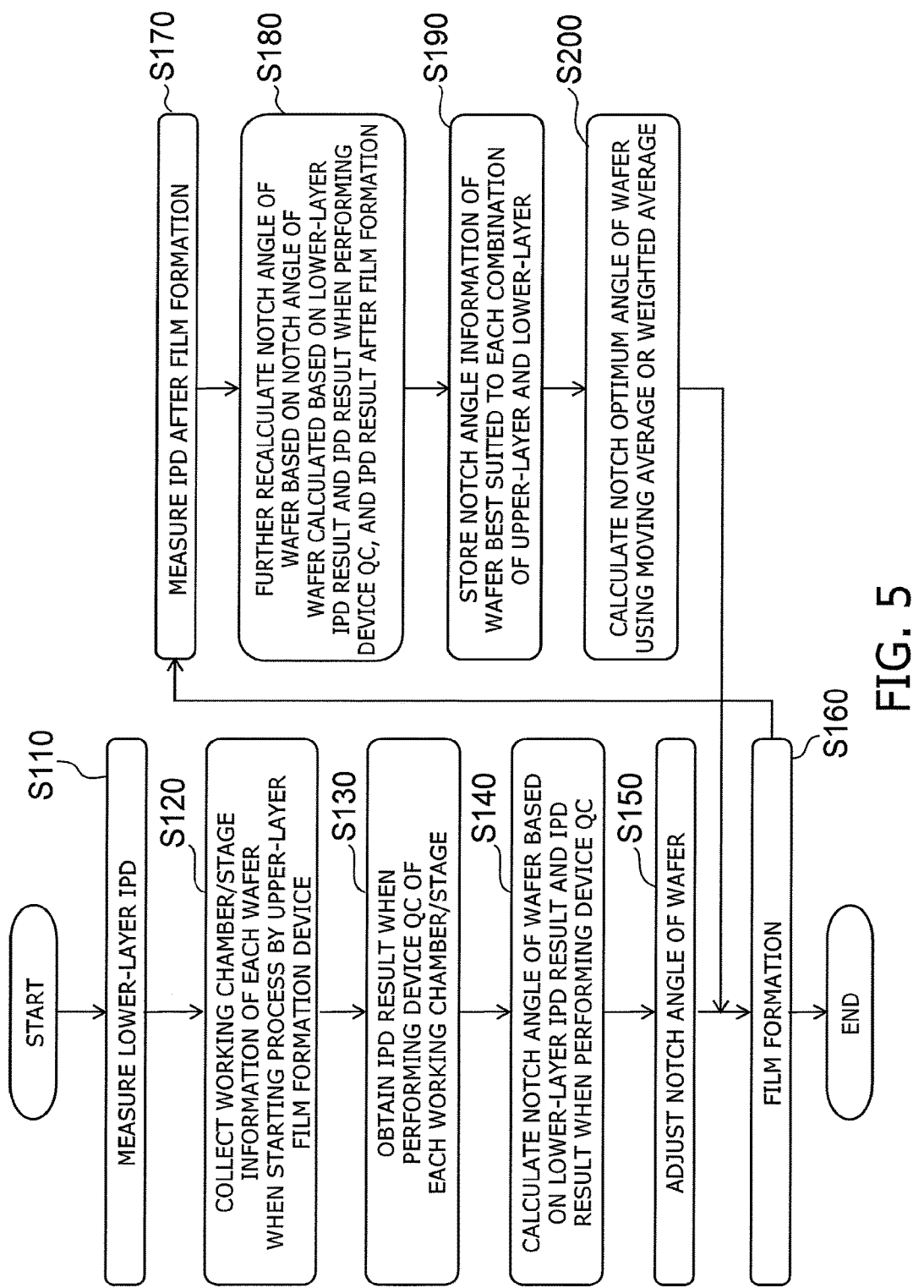
FIG. 5 is another flowchart showing the method of manufacturing the semiconductor device according to the embodiment.

FIG. 5 is another flowchart showing the method of manufacturing the semiconductor device according to the embodiment.

FIG. 4 and FIG. 5 are each a flowchart showing the formation of the stacked body having the lower layer and the upper layer performed on the substrate using the processing devices 10A, 10B.

Firstly, the flow of the method of manufacturing the semiconductor device in FIG. 4 will be described.

As shown in FIG. 4, the processing device 10A performs the film formation process to form the lower-layer stacked body on the substrate. The processing history (the processing history C2) of the processing device 10A is stored in the storage section 50.

Then, after the formation of the lower-layer stacked body, the measurement section 30 measures (S110) the value of the displacement of the wafer to measure the in-plane distortion IPD of the wafer due to the processing device 10A. The value of the displacement of the wafer is stored in the storage section 50 as the processing history (the processing history C3) of the measurement section 30, and the in-plane distortion IPD (IPD1) of the wafer due to the processing device 10A is stored in the storage section 50 as the lower-layer IPD.

Then, the analysis section 40 obtains (S120) the processing information of the chamber, the stage, and so on when starting the process by the processing device 10B. The processing information of the chamber, the stage, and so on is the data of the processing device 10B, and is transmitted from the storage section 50 to the analysis section 40.

Then, the analysis section 40 obtains (S130) the in-plane distortion IPD (IPD2) of the wafer due to the processing device 10B. The in-plane distortion IPD2 of the wafer is the data of the processing device 10B, and has been stored in the storage section 50 as the upper-layer IPD. It is also possible for the analysis section 40 to obtain the QC data of the chamber and the stage.

Then, the analysis section 40 calculates (S140) the notch angle of the wafer with which the in-plane distortion of the wafer due to the film stress is reduced in the case of forming the upper-layer stacked body on the lower-layer stacked body based on the in-plane distortion IPD of the wafer due to the processing device 10A and the in-plane distortion IPD of the wafer due to the processing device 10B. It is also possible for the analysis section 40 to calculate the notch angle of the wafer based on the processing history of the processing device 10A and the measurement section 30 in addition to the in-plane distortion IPD of the wafer due to the processing devices 10A, 10B. The notch angle calculated by the analysis section 40 is transmitted to the wafer transfer device 20.

Then, the wafer transfer device 20 sets (S150) the notch angle of the wafer to the preset angle based on the notch angle transmitted from the analysis section 40.

Then, the processing device 10B performs the film formation process to form (S160) the upper-layer stacked body on the lower-layer stacked body.

Subsequently, the flow of the method of manufacturing the semiconductor device in FIG. 5 will be described.

It should be noted that the process in S110 through S160 shown in FIG. 5 is the same as the process in S110 through S160 shown in FIG. 4, and therefore, the detailed description will be omitted.

As shown in FIG. 5, after forming the upper-layer stacked body due to the film formation process by the processing device 10B, the in-plane distortion IPD of the wafer is measured (S170). The measurement section 30 measures the in-plane distortion IPD of the wafer after the formation of the upper-layer stacked body. The in-plane distortion IPD of the wafer measured by the measurement section 30 can also be transmitted to an exposure device.

Then, the notch angle of the wafer is calculated once again (S180) based on the notch angle of the wafer calculated in S140, and the in-plane distortion IPD of the wafer measured in S170. The analysis section 40 calculates once again the notch angle of the wafer with which the in-plane distortion of the wafer due to the film stress is reduced.

Then, by calculating the notch angle of the wafer once again, the notch angle of the wafer best suited to each of the combinations between the upper-layer stacked body and the lower-layer stacked body is stored (S190). For example, such data of the notch angle is stored in the storage section 50 using a table or the like.

Then, the notch angle stored in S190 is optimized (S200) based on the moving average or the weighted average.

Subsequently, the process of S110 through S140 is performed once again, and then, in the case of setting the notch angle of the wafer in S150, the notch angle having been optimized in S200 is set. Subsequently, in S160, the processing device 10B performs the film formation process to form the upper-layer stacked body on the lower-layer stacked body.

In other words, after the process of S110 through S160, the process of S170 through S200 is performed to optimize the notch angle once again, and then the result is fed back in the case in which the process of S150 is performed once again.

Then, advantages of the embodiment will be described.

Figure 6:
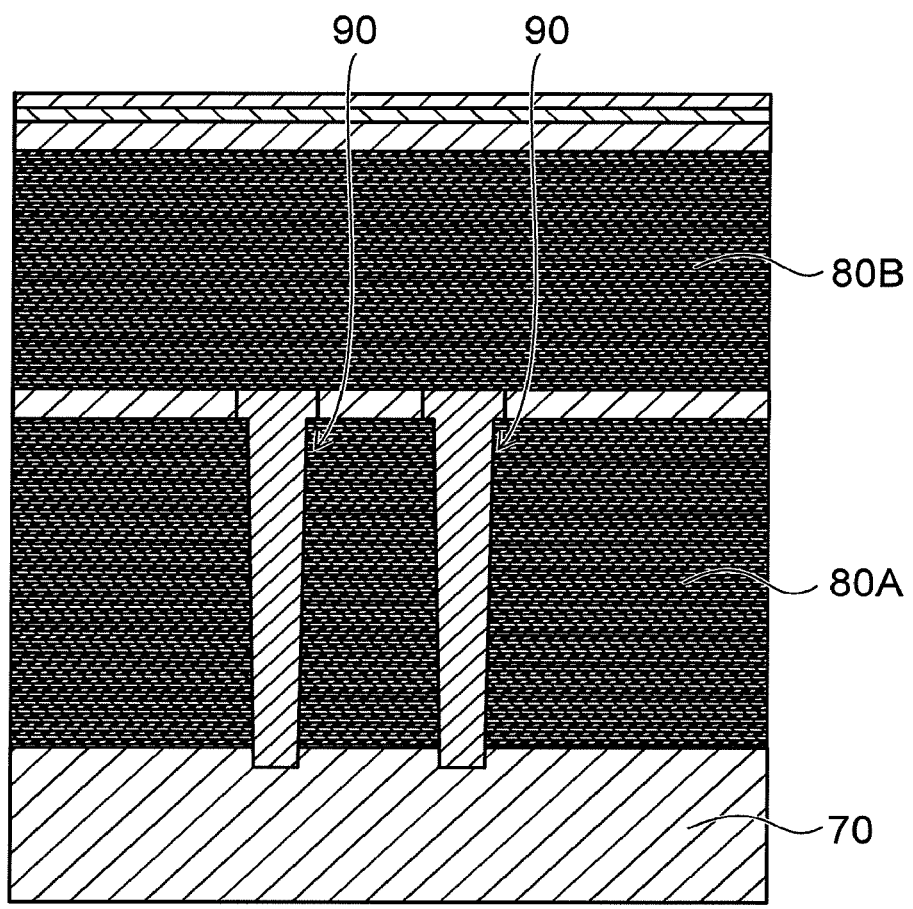
FIG. 6 is a diagram showing an example using the method of manufacturing the semiconductor device according to the embodiment.

FIG. 6 is a diagram showing an example using the method of manufacturing the semiconductor device according to the embodiment.

In the method of manufacturing the semiconductor storage device having a three-dimensional structure, the superposition control in the lithography process causes, in some cases, a difference in tendency of the in-plane distortion of the wafer between lots or between wafers due to the influence of the film stress by the stacking. Therefore, the exposure process is performed using a correction value of the exposure position calculated by performing the polynomial approximation of the displacement amount in an in-plane coordinate of the wafer based on the measurement result of the alignment immediately before the exposure. Further, the correction value of the exposure position calculated by performing the polynomial approximation of the displacement amount in the in-plane coordinate of the wafer based on the detection result of the superposition after the exposure is fed back to the exposure device.

However, in this control method, it results that multipoint measurement is performed in the plane of the wafer in the process of the alignment measurement immediately before the exposure and the superposition inspection after the exposure. Therefore, there is a possibility that the deterioration of the processes of the exposure device and the superposition inspection device is incurred.

Incidentally, there is proposed a control method of calculating the correction value of the exposure position based on the IPD of the wafer shape measurement result measured before the lithography process to perform a feedforward correction on the exposure device to perform the exposure.

However, according to this control method, since the shape measurement of the wafer becomes necessary in all of the processes in which the in-plane distortion of the wafer exists immediately before the exposure, the measurement time becomes long, although the superposition accuracy control is possible. Further, there is a possibility that the manufacturing cost increases due to an increase in the number of measurement processes.

In the embodiment, the film formation parameter is calculated to be optimized so as to reduce the in-plane distortion of the wafer due to the film stress based on the IPD of the wafer shape measurement result and the processing history in the previous process, the processing information of the chamber, the stage, and so on and the IPD of the wafer shape measurement result in the film formation process to be processed later. In other words, the notch angle of the wafer is calculated to be optimized so as to reduce the in-plane distortion of the wafer due to the film stress based on the in-plane distortion IPD of the wafer due to the processing device 10A, the processing history of the processing device 10A, the processing information of the chamber, the stage, and so on when starting the processing of the processing device 10B, and the in-plane distortion IPD of the wafer due to the processing device 10B. Thus, it is possible to perform the film formation process so as to reduce the difference in tendency of the in-plane distortion of the wafer between lots and between wafers.

Further, in the embodiment, it is possible to supply the foundation wafer with which the difference in tendency of the in-plane distortion of the wafer is reduced between lots and between wafers, and in which the IPD is stable before the lithography process. Further, due to the combination with the existing superposition control technology, the superposition accuracy can be ensured.

For example, the method of manufacturing the semiconductor device in the embodiment can be applied to the manufacture of the semiconductor storage device having a three-dimensional structure for forming memory holes by alternately repeating formation of the stacked body and formation of through holes. As shown in FIG. 6, the method can be applied to formation of the lower-layer stacked body 80A and the upper-layer stacked body 80B on the substrate 70. Further, the method can also be used for the alignment in the case of forming the through holes in the upper-layer stacked body 80B in accordance with the through holes 90 provided to the lower-layer stacked body 80A.

The scope of the embodiment described above also includes a processing method of storing a program (e.g., a program for executing the process of FIG. 4 and FIG. 5) for operating the constituents of the embodiment described above so as to realize the functions of the embodiment described above in a storage medium, then retrieving the program, which is stored in the storage medium, as codes to execute the codes in a computer. The computer readable recording medium is included in the range of the embodiment. In the storage medium storing the computer program described above, the computer program itself is included in the embodiment described above.

As the recording medium, it is possible to use, for example, a flexible disk, a hard disk, an optical disk, a magnetooptical disk, a CD-ROM, a magnetic tape, a nonvolatile memory card, or a ROM.

The scope of the embodiment described above includes not only those executing the process with the program stored in the recording medium described above alone, but also those operating on the OS in cooperation with other software or functions of an expansion board to execute the operation of the embodiment described above.

According to the embodiment, there are provided the manufacturing system for the semiconductor device and the method of manufacturing the semiconductor device with the yield ratio improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A manufacturing system for a semiconductor device comprising:
a first processing device and a second processing device each adapted to perform a film formation process on a substrate in a wafer;
a measurement section adapted to measure a first value related to a shape of the wafer after film formation by the first processing device, and then measure a second value related to a distortion of the wafer based on the first value; and
an analysis section adapted to change a film formation condition of the second processing device based on processing information of the first processing device, the second value, and information of the second processing device;
wherein the film formation condition of the second processing device is a notch angle of the wafer.

2. The system according to claim 1, wherein
the first value is a value related to a displacement of the wafer, and
the second value is a value related to an in-plane distortion of the wafer due to the first processing device.

3. The system according to claim 1, wherein
the information of the second processing device includes a value related to an in-plane distortion of the wafer due to the second processing device.

4. The system according to claim 1, wherein
the information of the second processing device includes information of a chamber and a stage.

5. The system according to claim 1, further comprising:
a storage section adapted to store the processing information of the first processing device, the second value, and the information of the second processing device.

6. The system according to claim 1, wherein
the measurement section measures a third value related to the shape of the wafer before the film formation by the first processing device.

7. A method of manufacturing a semiconductor device using a manufacturing system of the semiconductor device including a first processing device and a second processing device, a measurement section, and an analysis section, the method comprising:
forming, by the first processing device, a first film on a substrate in a wafer;
measuring, by the measurement section, a first value related to a shape of the wafer, and then measuring, by the measurement section, a second value related to a distortion of the wafer based on the first value;
changing, by the analysis section, a film formation condition of the second processing device based on processing information of the first processing device, the second value, and information of the second processing device; and
forming, by the second processing device, a second film on the first film based on the changed film formation condition;
wherein the film formation condition of the second processing device is a notch angle of the wafer.

8. The method according to claim 7, wherein
the first value is a value related to a displacement of the wafer, and
the second value is a value related to an in-plane distortion of the wafer due to the first processing device.

9. The method according to claim 7, wherein
the information of the second processing device includes a value related to an in-plane distortion of the wafer due to the second processing device.

10. The method according to claim 7, wherein
the information of the second processing device includes information of a chamber and a stage.

11. A method of manufacturing a semiconductor device using a manufacturing system of the semiconductor device including a first processing device and a second processing device, a measurement section, and an analysis section, the method comprising:
forming, by the first processing device, a first film on a substrate in a wafer;
measuring, by the measurement section, a first value related to a shape of the wafer, and then measuring, by the measurement section, a second value related to a distortion of the wafer based on the first value;
changing, by the analysis section, a film formation condition of the second processing device based on processing information of the first processing device, the second value, and information of the second processing device;
forming, by the second processing device, a second film on the first film based on the changed film formation condition;
measuring a value related to an in-plane distortion of the wafer after the formation of the second film; and
changing a notch angle of the wafer once again based on the value related to the in-plane distortion of the wafer.

12. The method according to claim 11, wherein
the first value is a value related to a displacement of the wafer, and
the second value is a value related to an in-plane distortion of the wafer due to the first processing device.

13. The method according to claim 11, wherein
the information of the second processing device includes a value related to an in-plane distortion of the wafer due to the second processing device.

14. The method according to claim 11, wherein
the information of the second processing device includes information of a chamber and a stage.

15. A control device comprising:
a measurement section adapted to measure a first value related to a shape of a wafer after forming a lower layer, and then measure a second value related to a distortion of the wafer based on the first value; and
an analysis section adapted to change a condition of a processing device when forming an upper layer based on processing information of the lower layer, the second value, and information of the upper layer;
wherein the condition of the processing device is a notch angle of the wafer.

16. The device according to claim 15, wherein
the first value is a value related to a displacement of the wafer, and
the second value is a value related to an in-plane distortion of the wafer.

17. The device according to claim 15, wherein
the information of the upper layer includes a value related to an in-plane distortion of the wafer due to the processing device.

18. The device according to claim 15, wherein
the information of the upper layer includes information of a chamber and a stage.

19. The device according to claim 15, further comprising:
a storage section adapted to store the processing information of the lower layer, the second value, and the information of the upper layer.
20. The device according to claim 15, wherein
the measurement section measures a third value related to the shape of the wafer before forming the lower layer.

* * * * *